(12) United States Patent
Holland

(10) Patent No.: US 6,417,441 B1
(45) Date of Patent: Jul. 9, 2002

(54) THERMOELECTRIC DEVICE THREE FOR PRODUCING AN ELECTRIC CURRENT

(76) Inventor: Beecher J. Holland, 600 Morison Ave., Kingsport, TN (US) 37660

( * ) Notice: Subject to any disclaimer, the term of this patent is extended or adjusted under 35 U.S.C. 154(b) by 0 days.

(21) Appl. No.: 09/805,967

(22) Filed: Mar. 9, 2001

(51) Int. Cl.⁷ .............................................. H01L 35/30
(52) U.S. Cl. ....................................... 136/205; 310/306
(58) Field of Search ........................... 136/205; 310/306

Primary Examiner—Bruce F. Bell
Assistant Examiner—Thomas H. Parsons

(57) ABSTRACT

The present invention is a thermoelectric cell for supplying an electric current. Two embodiments of the cell each comprise only one active component, a non-metallic electron emitter means, one embodiment built with a non-metallic substrate, a second embodiment encapsulated by a housing means, and a third embodiment wherein the emitter means is capable of standing alone and is either metallic or non-metallic.

3 Claims, 1 Drawing Sheet

THERMOELECTRIC DEVICE THREE FOR PRODUCING AN ELECTRIC CURRENT

BACKGROUND OF THE INVENTION

1. Field of the Invention

The present invention pertains to an electrical-current-producing thermoelectric device.

2. Description of the Related Art

The two most nearly related prior art devices, to the applicant's knowledge, are U.S. application Ser. No. 09/487,565, filed 01/19/2000, (now U.S. Pat. No. 6,245,986) and U.S. application Ser. No. 09/450,667, filed 11/30/99, (now U.S. Pat. No. 6,225,549). Both devices each, and apparently most other thermoelectric cells, comprise at least one metallic component, which differs from some embodiments of the present invention.

Most thermoelectric cells, to the applicant's knowledge, comprise multiple active components, differing from the present invention. Also, the output of most single thermoelectric cells, to the applicant's knowledge, is related to cell size, differing from at least some embodiments of the present invention.

SUMMARY OF THE INVENTION

The present invention is described in three different embodiments. Each of the embodiments is comprised of only one active component, the emitter means, which displays thermally-induced electron emission. In each of two embodiments, the one active component is non-metallic. In the third embodiment, the thermally-induced emitter means is either metallic or non-metallic.

The first embodiment comprises a non-metallic substrate, a structural vehicle, in contact with a single active component which is a non-metallic electron emitter, displaying thermally induced electron emission. Single-cell output from a given type of the first embodiment appears independent of cell size. Multiple first embodiment cells in continuous series appear to require an experimentally determined length-to-width ratio wherein $L=3^x \sqrt{10^x}$ W, or diameter instead of W, for each single cell. At least some series addition appears obtainable as the result of experimentally determined capacitance around a measuring increment of resistance in a circuit external to the cells. Even a small addition may be important given the fact that a cell can be quite small and apparently may be free of $I^2R$ effect. Two conductor lead means contacting the emitter at two different vicinities are not part of the cell design. The vicinity of a single cell like the first embodiment which is an anode appears to be that vicinity of the cell nearest, in terms of resistance, electrical load in a circuit external to the cell. It appears that in testing such cells, providing assurance that a meter part-circuit in parallel with a measuring increment of a circuit external to the cells allows less than one percent of output from the cells to pass through the meter replaces, at least partly, advantages of increased circuit resistance on the cathode side of the measuring increment previously seen to apparently increase cell output. Also, such part-circuit can serve to keep measurement values in the mv range which is often important because larger voltage readings apparently involve resistors in the meter which are of such material as to allow considerable migration, mentioned in Ser. No. 09/487,565, (now U.S. Pat. No. 6,245,986) and result in little or no reading.

The second embodiment comprises a single, non-metallic, liquid or gaseous or granular or castable solid, active component, a thermally-induced electron emitter, encapsulated in a housing means. Two conductor lead means contacting the emitter at two different vicinities are not part of the cell design. Such cell is amenable to granular or castable or liquid or gaseous emitter means. The conductor lead vicinity which is an anode is apparently that vicinity nearest, in terms of resistance, circuit load in a circuit external to the cell.

A third embodiment is comprised of only one active component, a thermally-induced electron emitter capable of standing alone, having no integral structural support member as part of the cell and being unencapsulated. The emitter means is either metallic or non-metallic. Two terminal lead means attached at different locations on the emitter means are not part of the cell design. The terminal lead means location which is an anode appears to be that location nearest, in terms of resistance, to electrical load in a circuit external to the cell. Output of at least the metallic version of the third embodiment appears essentially independent of cell size. The metallic cells appear partly additive with continuous cells in series when each cell conforms to $L=3^x \sqrt{10^x}$ W, or diameter. The metallic cells appear more additive than first embodiment cells and would be more amenable to operation at higher temperature. The cells may not maintain their initial percent addition. Experimentally-determined capacitance appears useful with the metallic cells as with the first embodiment.

BRIEF DESCRIPTION OF THE DRAWINGS

The three preferred embodiments of the present invention will herein be described by drawings for clarification of the design and function of the embodiments.

FIG. 1 shows a schematic of the first embodiment, one thermoelectric cell. Item 1 is the single active component of the cell, comprising an electron emitter of paraffin wax and a length of cotton thread as structural member which has been immersed in and then removed from molten paraffin wax. Item 2 is an anode conductor lead means of copper wire and is not part of the cell design. Item 3 is a cathode conductor lead means of copper wire and is not part of the cell design.

FIG. 2 shows a schematic of the second embodiment, one thermoelectric cell. Item 1 is the single active component of the cell, paraffin wax which has been cast into a plastic capsule item 4, housing means. Item 2 is an anode conductor lead means of metal and is not part of the cell design. Item 3 is a cathode conductor lead means of metal and is not a part of the cell design.

FIG. 1 also serves as a schematic of the third embodiment, one thermoelectric cell. Item 1 is the single active component of the cell, a piece of aluminum wire conforming to $L=3^x \sqrt{10^x}$ diameter. Item 2 is an anode conductor lead means of copper wire and is not a part of cell design. Item 3 is a cathode conductor lead means of copper wire and is not a part of the cell design.

DESCRIPTION OF THE PREFERRED EMBODIMENTS

Figure 1:
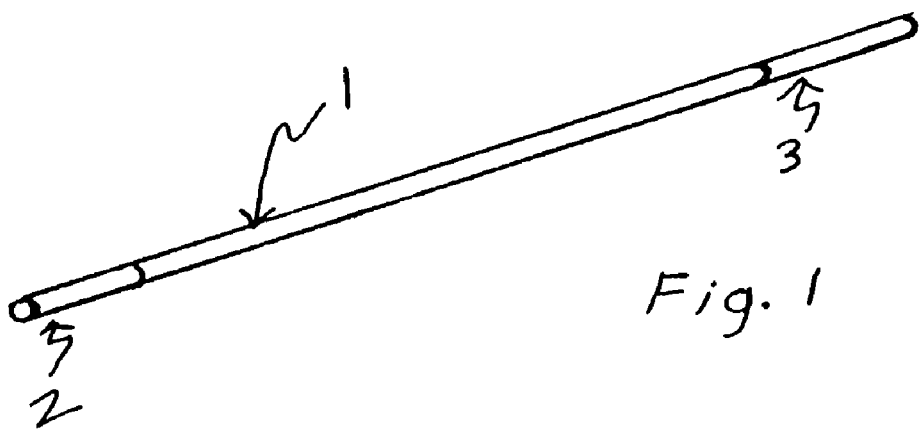
FIG. 1 is a schematic of the first embodiment showing one thermoelectric cell and serves also for the third embodiment.
Figure 2:
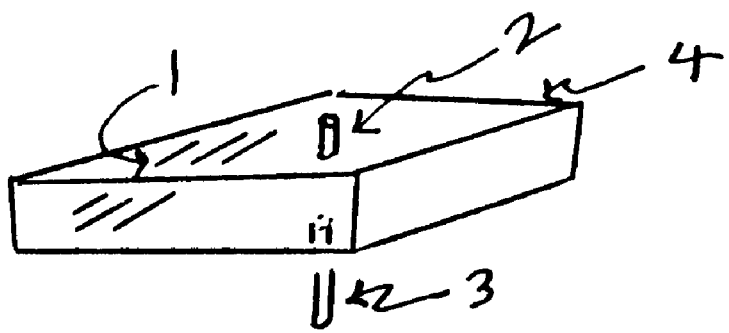
FIG. 2 is a schematic of the second embodiment showing one thermoelectric cell.

Each of the three embodiments functions in the same way. When the cell is exposed to heat from its surroundings and item 2 is connected to item 3 by circuitry external to the cell in which circuit electrical lead is nearer item 2, in terms of resistance, than to item 3, current flows 2 from item 2 to item 3 preferentially, apparently because the load being closer to the item 2 vicinity of the cell, puts more "pressure"on the item 2 vicinity than on the item 3 vicinity of the cell and thereby induces greater electron density in the item 2 vicinity and current flows from higher electron density to lower electron density.

I claim:

1. An electric-current-producing thermoelectric device comprising one thermoelectric cell comprised of a non-metallic substrate, being a structural vehicle, in contact with an active component being a non-metallic electron emitter, displaying thermally-induced electron emission, wherein a vicinity of said cell being an anode is that vicinity nearest, in terms of resistance, to an electrical load in a circuit external to said cell.

2. An electric-current-producing thermoelectric device comprising one thermoelectric cell comprised of a single non-metallic active component, gaseous or if liquid or granular or castable solid, being a thermally-induced electron emitter, encapsulated in a housing means wherein a vicinity of said emitter being an anode is that vicinity nearest, in terms of resistance, to an electrical load in a circuit external to said cell.

3. An electric-current-producing thermoelectric device comprising one thermoelectric cell comprised of one active component, being a thermally-induced electron emitter, either metallic or non-metallic and having no integral structural support wherein, a location on said emitter being an anode is the location nearest, in terms of resistance, to an electrical load in a circuit external to said cell.

* * * * *